(12) United States Patent
Chen et al.

(10) Patent No.: US 11,450,619 B2
(45) Date of Patent: Sep. 20, 2022

(54) EMBEDDED PACKAGING STRUCTURE HAVING SHIELDING CAVITY AND MANUFACTURING METHOD THEREOF

(71) Applicant: Zhuhai ACCESS Semiconductor Co., Ltd, Guangdong (CN)

(72) Inventors: Xianming Chen, Guangdong (CN); Min Gu, Guangdong (CN); Lei Feng, Guangdong (CN); Lina Jiang, Guangdong (CN); Benxia Huang, Guangdong (CN); Wenshi Wang, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 0 days.

(21) Appl. No.: 17/396,240

(22) Filed: Aug. 6, 2021

(65) Prior Publication Data
US 2022/0045014 A1    Feb. 10, 2022

(30) Foreign Application Priority Data
Aug. 7, 2020    (CN) .......................... 202010791224.4

(51) Int. Cl.
*H01L 23/552*    (2006.01)
*H01L 21/52*    (2006.01)
*H01L 21/56*    (2006.01)

(52) U.S. Cl.
CPC ............ *H01L 23/552* (2013.01); *H01L 21/52* (2013.01); *H01L 21/56* (2013.01)

(58) Field of Classification Search
CPC ........ H01L 23/552; H01L 21/52; H01L 21/56
USPC ......................................................... 257/659
See application file for complete search history.

(56) References Cited

U.S. PATENT DOCUMENTS

| | | | | |
|---|---|---|---|---|
| 2010/0308452 | A1* | 12/2010 | Iihola ...................... | H01L 24/81 257/692 |
| 2012/0119338 | A1* | 5/2012 | Watanabe ............. | H01L 23/552 257/659 |
| 2018/0197821 | A1* | 7/2018 | Shin ..................... | H01L 21/4853 |
| 2019/0214372 | A1* | 7/2019 | Chang ................... | H01L 21/568 |

\* cited by examiner

*Primary Examiner* — Didarul A Mazumder
(74) *Attorney, Agent, or Firm* — The PL Law Group, PLLC

(57) ABSTRACT

An embedded package structure having a shielding cavity according to an embodiment of the present disclosure includes a device embedded in an insulating layer, and a shielding cavity enclosing the device, wherein the shielding cavity is defined by a shielding wall embedded in the insulating layer and surrounding the device on four sides, and first and second wiring layers which cover first and second end faces of the shielding wall and are electrically connected with the shielding wall; wherein a signal line leading-out opening is to formed between the first end face of the shielding wall and the first wiring layer, and a signal line connected with a terminal of the device is led, from the signal line leading-out opening, out of the shielding cavity.

16 Claims, 7 Drawing Sheets

EMBEDDED PACKAGING STRUCTURE HAVING SHIELDING CAVITY AND MANUFACTURING METHOD THEREOF

CROSS-REFERENCE TO RELATED APPLICATION

This application claims the benefit under 35 USC § 119(a) of China Patent Application No. 202010791224.4, filed on Aug. 7, 2020, in the China Intellectual Property Office, the entire disclosure of which is incorporated herein by reference for all purposes.

BACKGROUND

1. Technical Field

The present invention relates to an electronic device package structure, and specifically to an embedded package structure having a shielding cavity and its manufacturing method.

2. Background of the Invention

The electromagnetic interference is mainly defined by an interference source, a transmission path and a sensitive device, wherein the interference source comprises a microprocessor, a microcontroller, a transmitter, electrostatic discharge and instantaneous power executing element, such as an electromechanical relay, a switch power source, lightning, etc. In a microcontroller system, the clock circuit is the largest broadband noise generator, wherein the noise is spread to the whole spectrum. With the development of a large number of high speed semiconductor devices, the edge transition rate thereof is very quick and this type of circuit will generate harmonic interference of up to 300 MHz.

The detriment of electromagnetic interference to electronic systems and electronic devices lies in that a strong electromagnetic interference may cause damage of a sensitive electronic device due to overloading. Generally, a Si transistor has a reverse breakdown voltage of 2~5V between the emitter and the base, and is easily to be damaged. Moreover, the reverse breakdown voltage will be decreased with the temperature increasing. The peak voltage due to electromagnetic interference may increase the concentration of impurities in certain points in the emitter junction and the collector junction, causing transistor breakdown or internal shorting. A transistor operating under a strong RF electromagnetic field may absorb sufficient energy such that the junction temperature is increased above an allowable temperature, thus causing damage. It is possible to increase additional loss of electricity generation, transmission, supply and consumption devices, make the devices overheating, and lower the efficiency and utilization rate of the devices. As the frequency of the harmonic current is integral times as large as the fundamental frequency, when a high frequency current flows through a conductor, the effective resistance of the conductor to the harmonic current will increase due to the skin effect, thus increasing the power loss and electricity energy loss, and aggravating heat generation of the conductor.

In traditional surface mounting products, the device, such as IGBT (insulated gate bipolar transistor), is an interference source of the electromagnetic interference and a sensitive part thereto. Generally, a metal shell is added outside the package (5 sides) to lower mass electromagnetic radiation emission or electromagnetic interference from outside, while the pin is provided on the sixth side, without shielding.

The prior art has the following disadvantages: (1) the shielding manner by adding a metal shell after packaging is suitable only for surface mounting, not for embedded products; (2) the metal shell can only prevent electromagnetic radiation from 5 directions and cannot prevent radiation from emitting and entering from the remaining side without shielding, and the electromagnetic radiation and interference may affect the positions of pins; (3) the pins are welded onto the mother board by solder balls which have a diameter and a height generally on the order of hundreds of microns now, and the protection without shielding on this side is difficult to achieve a whole shielding from the signal transmitting terminal to the transmission path.

Therefore, now there is an urgent need for an embedded package device having a shielding structure which can achieve full electromagnetic shielding.

SUMMARY

The embodiments of the present invention involve providing a solution for an embedded package structure having a shielding cavity structure and its manufacturing method, to solve the above technical problem(s). In the present invention, an almost completely enclosed shielding cavity structure is formed on six faces surrounding an embedded device, thus it is possible to reduce the distance between adjacent devices, improve the integration degree, and reduce the package volume.

The first aspect of the present invention relates to a package structure having a shielding cavity, comprising: a device embedded in an insulating layer, and a shielding cavity enclosing the device, wherein the shielding cavity is defined by a shielding wall embedded in the insulating layer and surrounding the device on four sides, and first and second wiring layers which cover first and second end faces of the shielding wall and are electrically connected with the shielding wall; wherein a signal line leading-out opening is formed between the first end face of the shielding wall and the first wiring layer, and a signal line connected with a terminal of the device is led, from the signal line leading-out opening, out of the shielding cavity.

In some embodiments, the shielding wall is formed by a Cu pillar.

In some embodiments, grounding shielding lines parallel to the signal line are provided on both sides of the signal line, to prevent the signal line from interference.

In some embodiments, the insulating layer comprises a packaging material. The packaging material is generally a polymer dielectric, and is preferably selected from one or more of prepreg, bismaleimide/triazine resin, polyimide, polyvinyl chloride, Ajinomoto buildup film, epoxy resin or polyphenylene oxide, and the combination(s) thereof.

In some embodiments, the device is selected from any one or more of a bare chip, a passive device, and a package, and the combination(s) thereof. Preferably, the device comprises a capacitor, an inductor, a RF chip, or an oscillator, etc.

In some embodiments, the shielding cavity is grounded.

In the second aspect of the present invention, a manufacturing method for an embedded package structure having a shielding cavity is provided, comprising the following steps:

(A) making a frame having a through hollow cavity, wherein the frame comprises a polymer dielectric and a shielding Cu pillar embedded in the polymer dielectric and surrounding the through hollow cavity;

(B) placing a device into the through hollow cavity and filling a packaging material to form a first insulating layer;

(C) applying a polymer dielectric onto a first surface of the first insulating layer to form a second insulating layer;

(D) forming a hole on the second insulating layer to reveal a first end face of the shielding Cu pillar and a terminal of the device, while retaining the polymer dielectric in a predetermined position of a signal line leading-out opening;

(E) forming a signal line, connected with the terminal of the device, on the second insulating layer, wherein the signal line passes through the position of the signal line leading-out opening;

(F) performing layer building up from the first end face of the shielding Cu pillar such that it extends beyond the second insulating layer;

(G) applying a polymer dielectric onto the shielding Cu pillar to form a third insulating layer;

(H) thinning the first and third insulating layers to reveal the first and second end faces of the shielding Cu pillar; and (I) forming first and second wiring layers on the third and first insulating layers wherein the first and second wiring layers cover the first and second end faces of the shielding Cu pillar and are electrically connected with the shielding Cu pillar.

In some embodiments, the step A further comprises:
applying a photoresist layer on a temporary bearing board and forming a first pattern by exposure and development;
plating a metal of Cu in the first pattern and forming the shielding Cu pillar and a sacrificing Cu pillar;
removing the photoresist layer;
applying a polymer dielectric layer to cover the shielding Cu pillar and the sacrificing Cu pillar;
thinning the polymer dielectric layer to reveal top end faces of the shielding Cu pillar and the sacrificing Cu pillar;
removing the temporary bearing board; and
performing etching to the sacrificing Cu pillar to form the through hollow cavity wherein the shielding Cu pillar surrounds the through hollow cavity, thereby obtaining the frame having the through hollow cavity.

In other embodiments, the step A further comprises:
applying a photoresist layer on a temporary bearing board and forming a first pattern by exposure and development;
plating a metal of Cu in the first pattern and forming the shielding Cu pillar;
removing the photoresist layer;
applying a polymer dielectric layer to cover the shielding Cu pillar;
thinning the polymer dielectric layer to reveal a top end face of the shielding Cu pillar;
removing the temporary bearing board; and
performing mechanical stamping/punching or laser drilling to the polymer dielectric layer to form the through hollow cavity surrounded by the shielding Cu pillar, thereby obtaining the frame having the through hollow cavity.

In some embodiments, the step B comprises:
applying an adhesive tape on one side of the frame;
placing the device into the through hollow cavity such that the device is attached onto the adhesive tape;
applying the packaging material on the other side of the frame to form the first insulating layer, wherein the packaging material fills a space between the device and the frame; and
removing the adhesive tape.

In some embodiments, the polymer dielectric is selected from one or more of prepreg, bismaleimide/triazine resin, polyimide, polyvinyl chloride, Ajinomoto buildup film, epoxy resin or polyphenylene oxide/ether, and the combination(s) thereof. Preferably, the polymer dielectric may be a photosensitive resin material, such as a photosensitive polyimide or a photosensitive polyphenylene oxide/ether.

In some embodiments, the step E further comprises:
forming shielding lines on both sides of the signal line wherein the shielding lines and the signal line together pass through the position of the signal line leading-out opening.

In some embodiments, the step F further comprises:
applying a photoresist layer on the second insulating layer;
performing exposure and development to the photoresist layer to form a hole revealing the first end face of the shielding Cu pillar;
plating Cu to the hole and forming the built-up shielding Cu pillar; and
removing the photoresist layer.

In some embodiments, the step H further comprises:
performing the thinning in a manner of mechanical grinding or plasma etching.

In some embodiments, the step I further comprises:
applying seed layers on the third and first insulating layers which reveal the first and second end faces of the shielding Cu pillar;
applying a photoresist layer on the seed layer;
performing patterning to form a wiring pattern;
plating Cu in the wiring pattern;
peeling the photoresist layer; and
removing the seed layer.

BRIEF DESCRIPTION OF THE DRAWINGS

In order to better understand the present invention and illustrate the embodiments of the present invention, the accompanying drawings are referred to only in an exemplary way.

Specifically referring to the Figures/drawings, it should be emphasized to that the specific graphical representation is provided only in an exemplary way, and only for the purpose of illustrative discussion of the preferred embodiments of the present invention. The graphical representation is provided for the reason that the Figures are believed to be useful to make the description of the principle(s) and concept(s) of the present invention understood easily. In this regard, it is intended to illustrate the structural details of the present invention only in a detail degree necessary to generally understand the present invention. The several solutions of the present invention embodied in practice can be appreciated by those skilled in the art with the specific explanation referring to the Figures. In the Figures.

DETAILED DESCRIPTION

Figure 1:
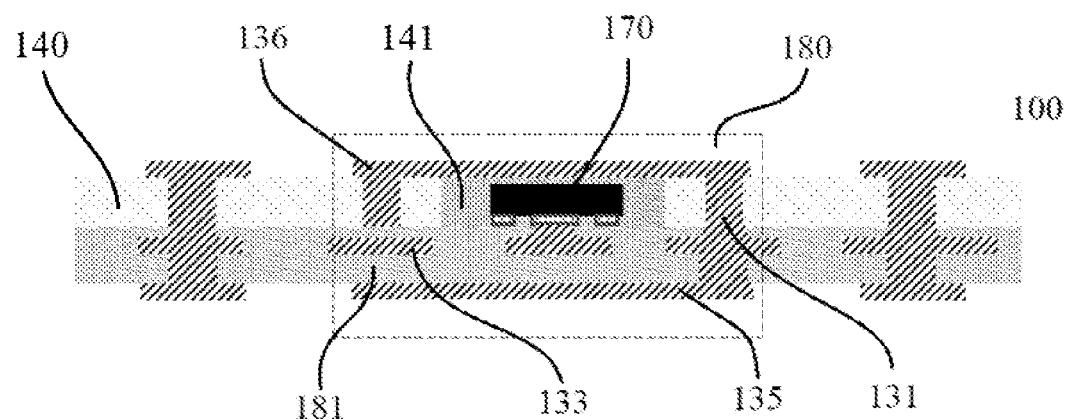
FIG. 1 is a schematic section view of an embedded package structure having a shielding cavity according to an embodiment of the present invention.

Referring to FIG. 1, it shows a schematic section view of an embedded package structure 100. the package structure 100 comprises a first insulating layer 141, a device 170 embedded in the first insulating layer 141, and a shielding cavity 180 surrounding and enclosing the device 170, wherein the shielding cavity 180 is defined by a shielding wall 131 embedded in a polymer dielectric layer 140 and surrounding the device 170 on four sides, and first and second wiring layers 135 and 136 which cover first and second end faces 121 and 122 of the shielding wall 131 and are electrically connected with the shielding wall 131. A signal line leading-out opening 181 is formed between the shielding wall 131 and the first wiring layer 135, and a signal line 133 connected with a terminal 171 of the device 170 is led, from the signal line leading-out opening 181, out of the shielding cavity 180.

The first insulating layer 141 may be of a packaging material, generally a polymer dielectric, preferably selected from one or more of prepreg, bismaleimide/triazine resin, polyimide, polyvinyl chloride, Ajinomoto buildup film (ABF), epoxy resin or polyphenylene oxide/ether, and the combination(s) thereof. Preferably, the first insulating layer 141 may be of a thermosetting resin material (such as Taiyo Zaristo909S) or a photosensitive resin material (such as Hitachi PVF-02).

The embedded device 170 may be a device emitting electromagnetic interference or being sensitive to electromagnetic interference. It may be any one or more of a bare chip, a passive device, and a package, and the combination(s) thereof. Preferably, the device comprises a capacitor, an inductor, a RF chip, or an oscillator, etc.

The shielding wall 131 may have a rectangle loop shape structure consisting of a Cu via-pillar, surrounding the device 170 on four sides to prevent lateral electromagnetic interference.

On both sides of the signal line 133 led out from the terminal 171 of the device 170, it is possible to further provide shielding lines 132. The shielding lines 132 may be connected with the shielding wall or be grounded, to protect the signal line 133 from electromagnetic interference during transmission.

The signal line 133, after being led out of the shielding cavity 180, may be formed with a terminal for electrically connecting a substrate.

Figure 2A:
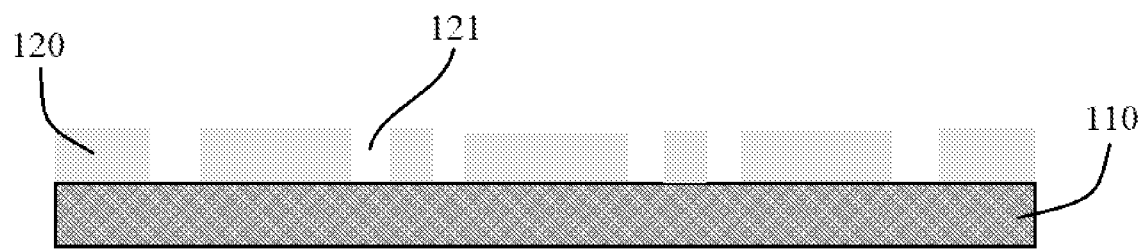
FIGS. 2(a)~2(q) show schematic diagrams of intermediate structures of various steps of a manufacturing method for the package structure as shown in FIG. 1.
Figure 2B:
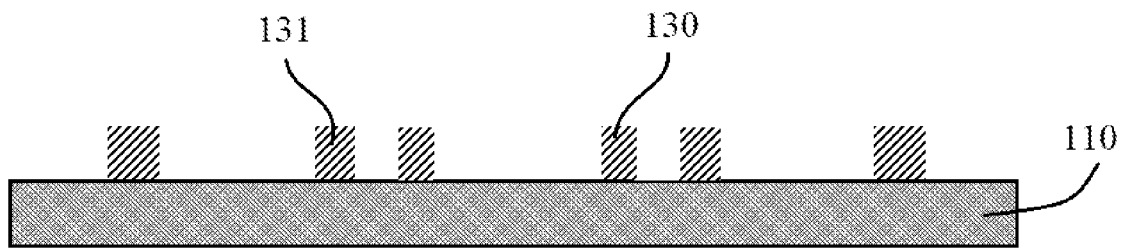
Figure 2C:
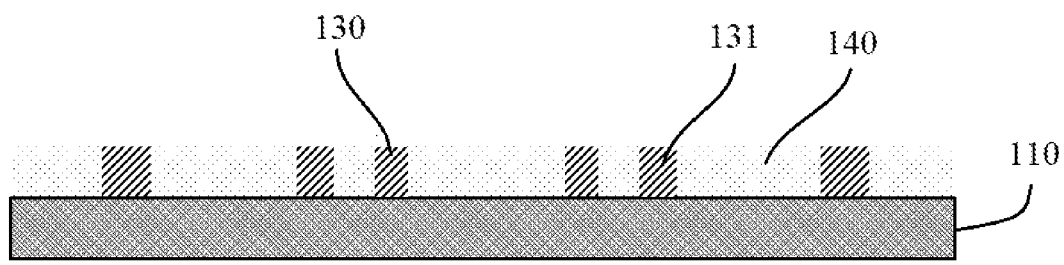
Figure 2D:
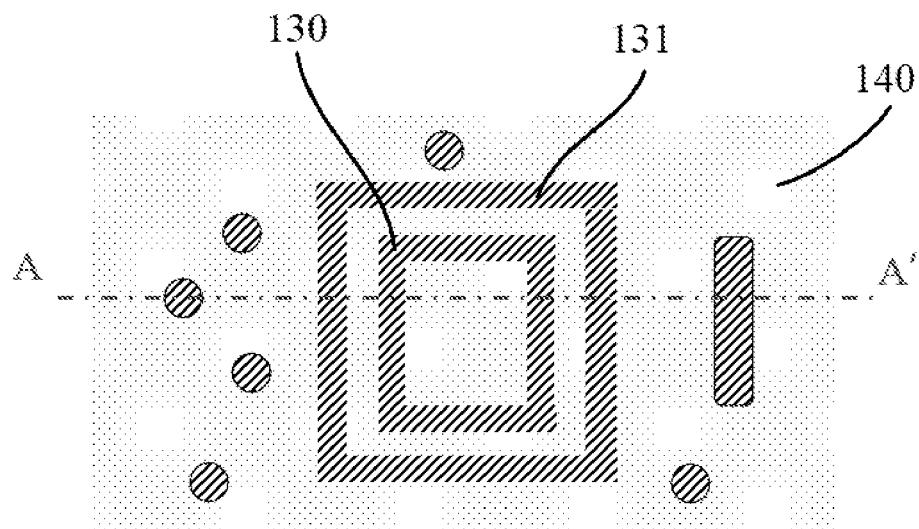
Figure 2E:
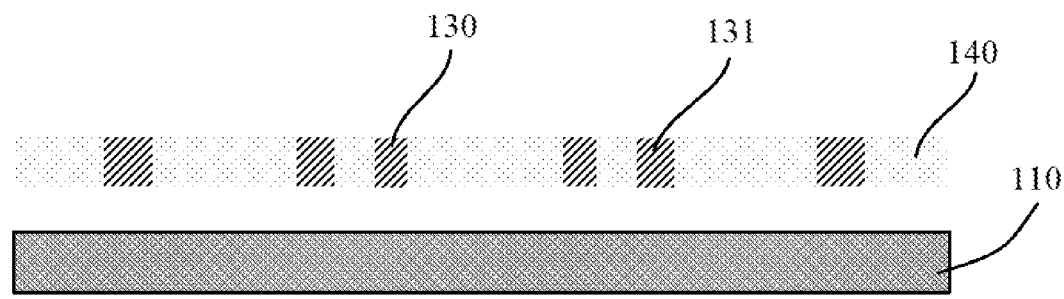
Figure 2F:
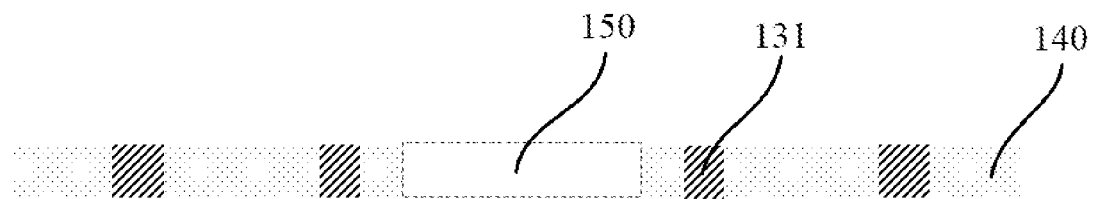
Figure 2G:
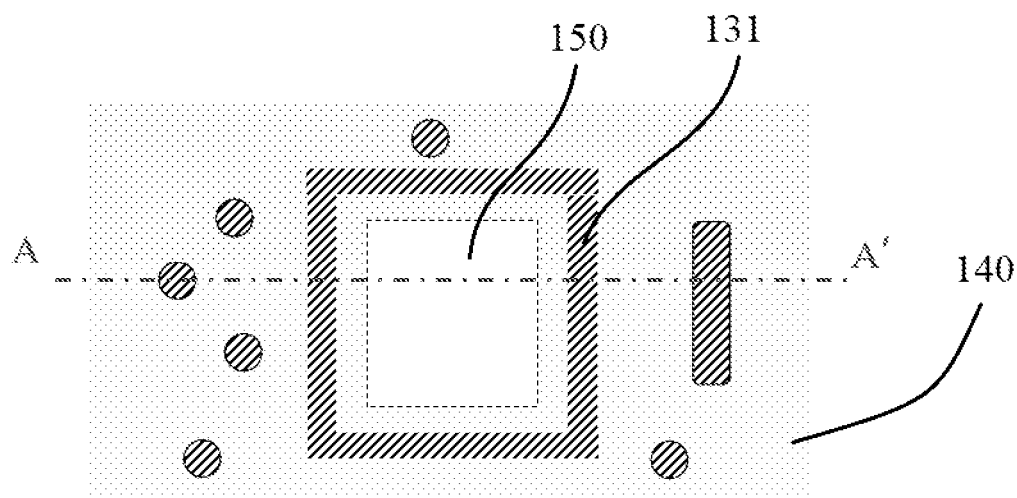
Figure 2H:
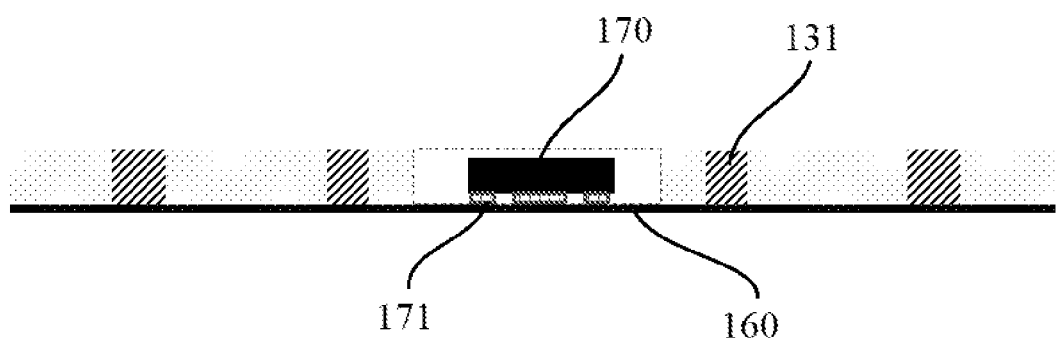
Figure 2I:
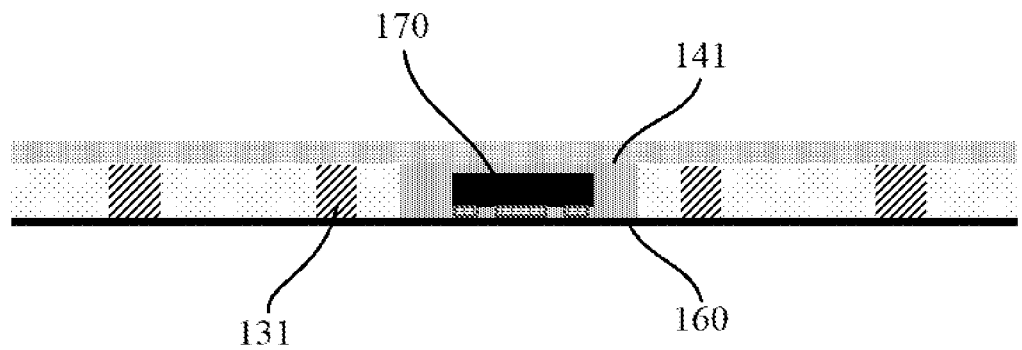
Figure 2J:
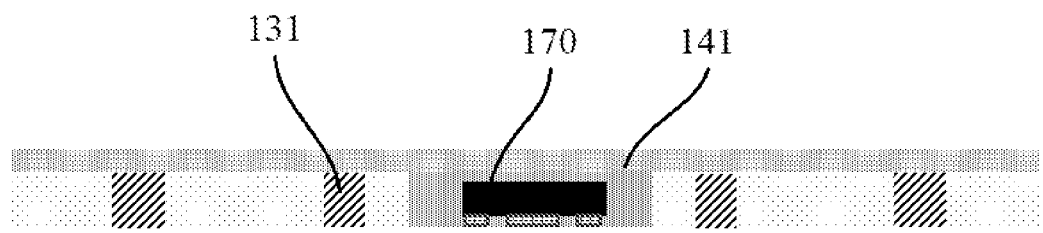
Figure 2K:
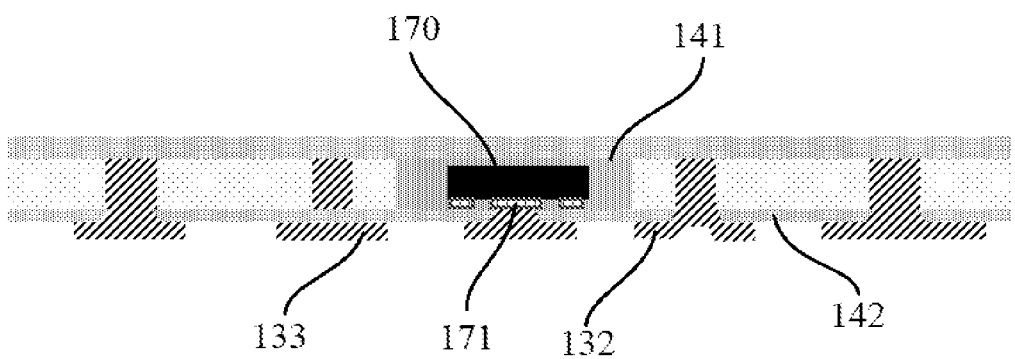
Figure 2L:
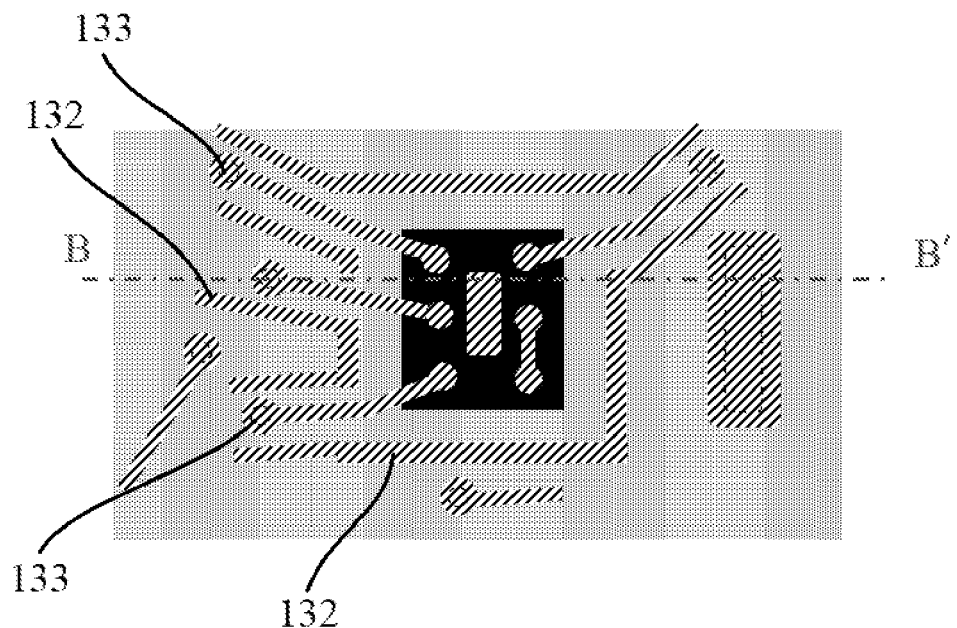
Figure 2M:
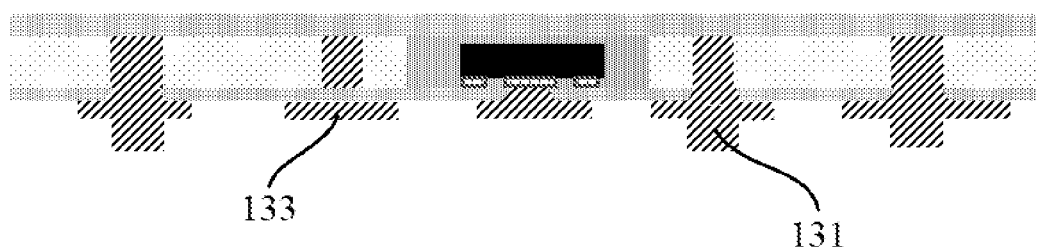
Figure 2N:
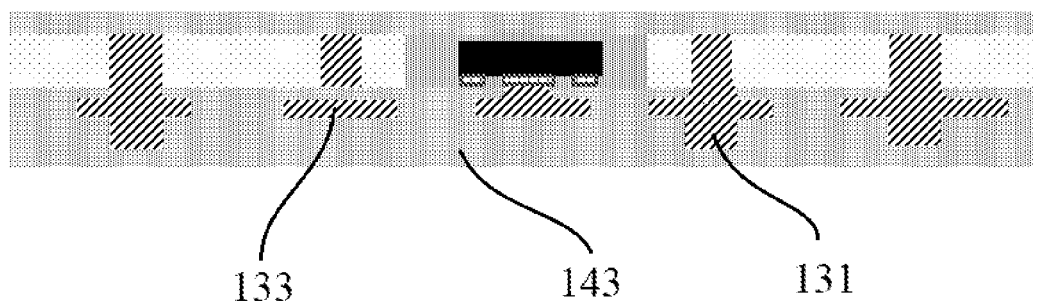
Figure 2O:
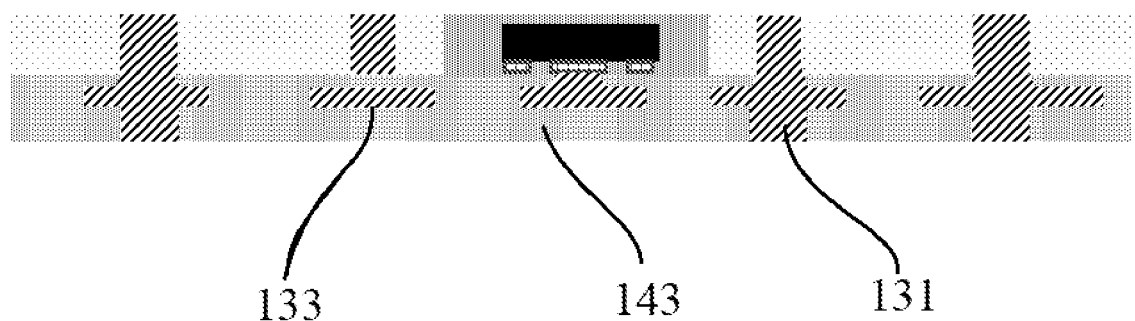

Referring to FIGS. 2(a)–2(o), schematic diagrams of intermediate structures of various steps of a manufacturing method for the embedded package structure 100 having the shielding cavity shown in FIG. 1 are shown.

The manufacturing method for the embedded package structure 100 comprises the following steps:

Applying a photoresist layer 120 on a temporary bearing board 110 and forming a first pattern 121 by exposure and development, as shown in FIG. 2(a). The temporary bearing board 110 may be a glass substrate, a sacrificing Cu foil, or a Cu clad laminate (CCL), such as a CCL covered with Cu foil double layers on a single side or on both sides. In the present invention, it is possible to use the temporary bearing board to perform layer building up on a single side or on both sides. In the present embodiment, only the layer building up on a single side is shown as an example.

Plating a metal of Cu in the first pattern 121 and removing the photoresist layer 120, and forming the shielding Cu pillar 131 and a sacrificing Cu pillar 130, as shown in FIG. 2(b). The plating a metal of Cu may generally be performed by electroplating. According to the design, the first pattern 121 may comprises more Cu pillar(s), such as a conductive Cu pillar for conducting feature structures, etc.

Applying a polymer dielectric layer 140 to cover the shielding Cu pillar 131 and the sacrificing Cu pillar 130, and then thinning the polymer dielectric layer 140 to reveal top end faces of the shielding Cu pillar 131 and the sacrificing Cu pillar 130, as shown in FIG. 2(c). The polymer dielectric layer 140 forms a main body of the frame and provides rigid supporting for the frame, and is generally selected from one or more of prepreg, bismaleimide/triazine resin, polyimide, polyvinyl chloride, Ajinomoto buildup film (ABF), epoxy resin or polyphenylene oxide/ether, and the combination(s) thereof.

FIG. 2(d) is a top view for FIG. 2(c), and FIG. 2(c) is a section view along a line A-A' in FIG. 2(d). As shown in FIG. 2(d), the shielding Cu pillar 131 and the sacrificing Cu pillar 130 form a pattern in a shape of nested rectangular loops in which the shielding Cu pillar 131 surrounds the sacrificing Cu pillar 130.

The next step is: removing the temporary bearing board 110, as shown in FIG. 2(e).

The next step is: etching off the sacrificing Cu pillar 130 to form a through hollow cavity 150 in the frame 140 wherein the shielding Cu pillar 131 surrounds the through hollow cavity 150, thereby obtaining the frame 140 having the through hollow cavity 150, as shown in FIG. 2(f). When the temporary bearing board 110 is a CCL having Cu foil double layers, as the Cu foil double layers are attached together by physical lamination, it is possible to remove the CCL by simple separation of the Cu foil double layers, and the single layer of Cu foil attached on the frame 140 may be removed by etching. The sacrificing Cu pillar 130 may be etched by a method comprising: forming an etching resisting layer by patterning a photoresist, and removing the etching resisting layer after etching.

Alternatively, the through hollow cavity 150 may be formed by a method comprising: forming only a shielding Cu pillar 131 in a rectangular loop shape on the temporary bearing board 110, laminating the polymer dielectric layer 140 and thinning it to reveal the top end face of the shielding Cu pillar 131, then removing the temporary bearing board 110, performing mechanical stamping/punching or laser drilling to the polymer dielectric layer 140 to form the through hollow cavity 150 surrounded by the shielding Cu pillar 131, thereby obtaining the frame 140 having the through hollow cavity 150.

FIG. 2(g) is a top view of FIG. 2(f), wherein the shielding Cu pillar 131 is formed as a shielding wall in a rectangular loop shape surrounding the through hollow cavity 150.

The next step is: applying an adhesive tape 160 on one side of the frame 140; placing the device 170 into the through hollow cavity 150 such that the device 170 is attached and fixed onto the adhesive tape 160, as shown in FIG. 2(h). The adhesive tape 160 may be a thermo-decomposing or photo-decomposing adhesive tape which may be decomposed by heating or UV light radiation. The device 170 is placed in the region of the etched hollow cavity 150. The device 170 may be a capacitor, an inductor, etc. which may cause electromagnetic interference to outside, or may be a function device (such as a RF chip, an oscillator, etc.) which needs resisting interference. The device 170 is temporarily fixed by the adhesive tape 160, and the device terminal face 171 is fixed onto the adhesive tape 160.

Multiple devices 170 may be attached in the same hollow cavity 150 according to the function and design, or may be attached in individual hollow cavities (each having its respective shielding wall). It is also possible to place multiple devices which do not need shielding in one or more hollow cavities without any shielding structure.

The height difference between the thickness of the device 170 and the depth of the hollow cavity 150 should be not less than 5 μm, and generally is 5~30 μm. However, when the embedded device 170 is operating under a condition of an extremely high voltage, it is possible to appropriately increase the height difference between the device back face and the upper edge of the hollow cavity 150 according to the voltage withstanding property of the packaging material, to avoid breakdown. For example, when the embedded device is operating under a voltage of 12V, the height difference should be controlled as 15 μm; but when the embedded device is operating under a voltage of 650V, the height difference should be controlled as 50~70 μm. Certainly, such height difference is not provided in a limiting sense, and can be determined by the voltage withstanding property of the selected packaging material.

The next step is: applying the packaging material on the other side of the frame 140 to form the first insulating layer 141 such that the packaging material fills the gap between the device 170 and the frame 140, as shown in FIG. 2(i). Generally, it is necessary for the packaging material 141 to have an excellent space filling ability. Preferably, the packaging material is in a form of film, powder, or liquid. It may fill the space between the hollow cavity 150 and the device 170 in a manner of film attaching, injection, or coating/screen printing. Preferably, it is selected from polyimide, polyvinyl chloride, Ajinomoto buildup film (ABF), polyphenylene oxide/ether, or epoxy resin, etc. The packaging material may be same as or different from the polymer dielectric layer 140. It is generally necessary for the frame 140 to provide rigid supporting for the structure, and it is generally necessary for the packaging material to have an excellent space filling ability. Therefore, preferably, various combinations thereof are obtained by different packaging materials. For example, it is possible to use prepreg (PP) or bismaleimide/triazine (BT) resin as the frame material and use Ajinomoto buildup film (ABF) as the first insulating layer 141. The ABF has an excellent flowability and can appropriately fill the space between the devices, while the PP or BT has a glass fiber structure and thus can provide sufficient rigid supporting.

The next step is: removing the adhesive tape 160, as shown in FIG. 2(j). The adhesive tape 160 may be removed by decomposition with heating or UV light radiation.

The next step is: applying a resin material onto a first surface (lower surface) of the first insulating layer 141 (i.e., the device terminal face 171) to cover the whole board face, to form a second insulating layer 142, as shown in FIG. 2(k). The second insulating layer 142 may be of a material of prepreg (PP) or film-like layer building up material, such as ABF, PI, PPO, etc.

The next step is: forming a hole on the second insulating layer 142 to reveal a bottom end face of the shielding Cu pillar 131 and a terminal face 171 of the device 170, while retaining the resin in a predetermined position of the signal line leading-out opening, to prevent a signal line from contacting the shielding Cu pillar 131; then forming a signal line 133, connected with a terminal 171 of the device 170, on the second insulating layer 142 such that the signal line 133 passes through the position of the signal line leading-out opening 181, as shown in FIG. 2(l). Also, it is possible to open and reveal a bottom end face of another Cu pillar, such as a conductive Cu pillar, such that the conductive Cu pillar can be simultaneously built up with the shielding Cu pillar 131.

The manner of opening the second insulating layer 142 to reveal the bottom end face of the Cu pillar is generally achieved by laser drilling, but it is not limited thereto. For example, when a photosensitive resin material (such as PI) is used as the resin material 142, a manner of exposure and development may be used directly.

FIG. 2(l) is a bottom view of FIG. 2(k), wherein FIG. 2(k) is a section view along a line B-B' in FIG. 2(l). Generally, on each side of the signal line 133, a shielding line 132 parallel thereto is provided. These two shielding lines 132 parallel to the signal line 133 are finally grounded such that any electromagnetic induction produced by a high frequency signal on the signal line 133 can be conducted/guided to the ground in time to avoid electromagnetic interference to other circuits or surrounding devices.

The next step is: performing layer building up downwards from the revealed bottom end face of the shielding Cu pillar 131 such that it extends beyond the second insulating layer 142, as shown in FIG. 2(m). Also, it is possible to simultaneously perform layer building up to another Cu pillar, such as a conductive Cu pillar. Such layer building up may be achieved by the coreless substrate layer building up processing by Zhuhai ACCESS, which, for example, comprises: applying a photoresist layer on the second insulating layer 142; patterning the photoresist layer to form the hole revealing the bottom end face of the shielding Cu pillar 131; plating Cu to the hole and forming the built-up shielding Cu pillar 131; and removing the photoresist.

The next step is: applying a polymer dielectric onto the bottom end face of the shielding Cu pillar 131 to form a third insulating layer 143, as shown in FIG. 2(n).

The next step is: performing thinning on both sides to thin the first and third insulating layers 141 and 143 to reveal the bottom and top end faces of the shielding Cu pillar 131, as shown in FIG. 2(o). Also, it is possible to reveal two end faces of a conductive Cu pillar to facilitate further layer building up. The processing of thinning may be achieved by chemical mechanical grinding or plasma etching, etc.

Figure 2P:
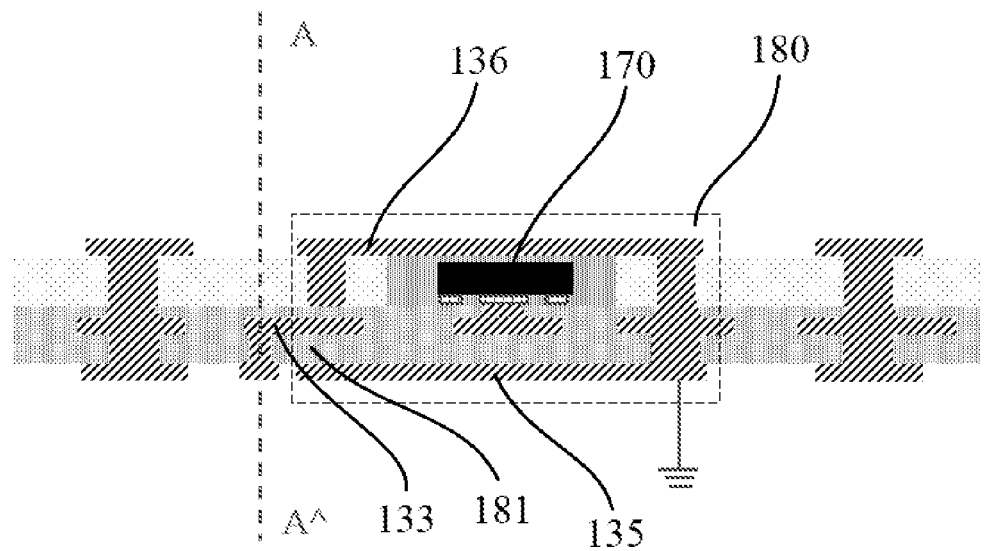

The final step is: forming first and second wiring layers 135 and 136 on the third and first insulating layers 143 and 141 such that the first and second wiring layers 135 and 136 cover the top and bottom end faces of the shielding Cu pillar 131 and are electrically connected with the shielding Cu pillar 131, as shown in FIG. 2(p).

Generally, the wiring layer is made by Cu or Al, and the first and second wiring layers 135 and 136 may be conducted by an interlayer conductive Cu pillar. The processing for forming the first and second wiring layers 135 and 136 may comprises: sputtering seed layers (such as Cu, Ti, or other metals) on the lower surface of the third insulating layer 143 and the upper surface of the first insulating layer 141, respectively; then applying a photoresist and performing patterning to form a via or a feature structure; then electroplating Cu in the pattern; peeling the photoresist; and then etching off the revealed seed layers.

The next step may be: further applying insulating layers and feature structures on the wiring layers 135 and 136 to perform layer building up operation, forming a structure with multiple layers connected with each other, such as a package-on-package (PoP) structure, etc.

Therefore, the shielding Cu pillar 131 in the rectangular loop shape and the wiring layers 135, 136 stacked in upper and lower layers together form the shielding cavity 180 surrounding the device 170. Except for the signal line leading-out opening 181, the shielding cavity 180 almost hermetically encloses the device 170. As the width of the signal line leading-out opening 181 (i.e., the thickness of the second insulating layer) is only 2-4 times of the width of the signal line 133 and parallel shielding lines 132 may be provided on both sides of the signal line 133, the shielding cavity 180 of the present invention can achieve almost perfect device electromagnetic shielding such that the electromagnetic interference emitted or induced by the device in the shielding cavity 180 is minimized.

The shielding cavity 180 needs to be finally grounded to conduct/guide the electromagnetically induced current produced on the surface of the shielding cavity 180 into the ground to avoid signal crosstalk. The shielding line 132 may be grounded by connection with the shielding Cu pillar 131.

Figure 2Q:
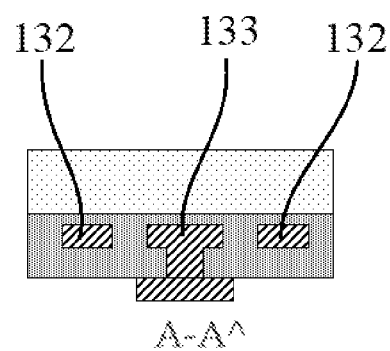

FIG. 2(q) is a section view along a line A-A^ of FIG. 2(p). The signal line 133 and the shielding lines 132 may together be led, from the signal line leading-out opening 181, out of the shielding cavity 180. The signal line 133, being led out from the terminal 171 of the device 170, may be formed with a terminal on the third insulating layer 143 by the processing of hole-opening, Cu filling, etc. for connecting with a substrate, such as a PCB board.

In the final processing, the package panel frame can be divided into individual package assemblies. The dividing or cutting may be achieved by using a rotating saw blade or other cutting technologies, such as using a laser.

It will be appreciated by those skilled in the art that the present invention is not limited to the contents as specifically illustrated and described above. Moreover, the scope of the present invention is defined by the appended claims, comprising combinations and sub-combinations of the various technical features as described above as well as the variations and modifications thereof, which can be anticipated by those skilled in the art by reading the above description.

In the claims, the term "comprise" and its variations, such as "comprises", "comprising", etc., mean that the element(s) as listed will be included, generally without excluding other element(s).

What is claimed is:

1. An embedded package structure having a shielding cavity, comprising:
   a device embedded in an insulating layer, and a shielding cavity enclosing the device,
   wherein the shielding cavity is defined by a shielding wall embedded in the insulating layer and surrounding the device on four sides, and first and second wiring layers which cover first and second end faces of the shielding wall and are electrically connected with the shielding wall;
   wherein a signal line leading-out opening is formed between the first end face of the shielding wall and the first wiring layer, and a signal line connected with a terminal of the device is led, from the signal line leading-out opening, out of the shielding cavity.

2. The embedded package structure according to claim 1, wherein the shielding wall is formed by a Cu pillar.

3. The embedded package structure according to claim 1, wherein parallel grounding shielding lines are provided on both sides of the signal line.

4. The embedded package structure according to claim 1, wherein the insulating layer comprises a packaging material.

5. The embedded package structure according to claim 4, wherein the packaging material is selected from one or more of prepreg, bismaleimide/triazine resin, polyimide, polyvinyl chloride, Ajinomoto buildup film, epoxy resin or polyphenylene oxide, and the combination(s) thereof.

6. The embedded package structure according to claim 1, wherein the device is selected from any one or more of a bare chip, a passive device, and a package, and the combination(s) thereof.

7. The embedded package structure according to claim 1, wherein the shielding cavity is grounded.

8. A manufacturing method for an embedded package structure having a shielding cavity, comprising the following steps:
   (A) making a frame having a through hollow cavity, wherein the frame comprises a polymer dielectric and a shielding Cu pillar embedded in the polymer dielectric and surrounding the through hollow cavity;
   (B) placing a device into the through hollow cavity and filling a packaging material to form a first insulating layer;
   (C) applying a polymer dielectric onto a first surface of the first insulating layer to form a second insulating layer;
   (D) forming a hole on the second insulating layer to reveal a first end face of the shielding Cu pillar and a terminal of the device, while retaining the polymer dielectric in a predetermined position of a signal line leading-out opening;
   (E) forming a signal line, connected with the terminal of the device, on the second insulating layer, wherein the signal line passes through the position of the signal line leading-out opening;
   (F) performing layer building up from the first end face of the shielding Cu pillar such that it extends beyond the second insulating layer;
   (G) applying a polymer dielectric onto the shielding Cu pillar to form a third insulating layer;
   (H) thinning the first and third insulating layers to reveal the first and second end faces of the shielding Cu pillar; and
   (I) forming first and second wiring layers on the third and first insulating layers wherein the first and second wiring layers cover the first and second end faces of the shielding Cu pillar and are electrically connected with the shielding Cu pillar.

9. The manufacturing method according to claim 8, wherein the step A further comprises:
   applying a photoresist layer on a temporary bearing board and forming a first pattern by exposure and development;
   plating a metal of Cu in the first pattern and forming the shielding Cu pillar and a sacrificing Cu pillar;
   removing the photoresist layer;
   applying a polymer dielectric layer to cover the shielding Cu pillar and the sacrificing Cu pillar;
   thinning the polymer dielectric layer to reveal top end faces of the shielding Cu pillar and the sacrificing Cu pillar;
   removing the temporary bearing board; and
   performing etching to the sacrificing Cu pillar to form the through hollow cavity wherein the shielding Cu pillar surrounds the through hollow cavity, thereby obtaining the frame having the through hollow cavity.

10. The manufacturing method according to claim 8, wherein the step A further comprises:
    applying a photoresist layer on a temporary bearing board and forming a first pattern by exposure and development;
    plating a metal of Cu in the first pattern to form the shielding Cu pillar;
    removing the photoresist layer;
    applying a polymer dielectric layer to cover the shielding Cu pillar;
    thinning the polymer dielectric layer to reveal a top end face of the shielding Cu pillar;
    removing the temporary bearing board; and
    performing mechanical stamping/punching or laser drilling to the polymer dielectric layer to form the through hollow cavity surrounded by the shielding Cu pillar, thereby obtaining the frame having the through hollow cavity.

11. The manufacturing method according to claim 8, wherein the step B comprises:
    applying an adhesive tape on one side of the frame;
    placing the device into the through hollow cavity such that the device is attached onto the adhesive tape;
    applying the packaging material on the other side of the frame to form the first insulating layer, wherein the packaging material fills a space between the device and the frame; and
    removing the adhesive tape.

12. The manufacturing method according to claim 8, wherein the polymer dielectric is selected from one or more of prepreg, bismaleimide/triazine resin, polyimide, polyvinyl chloride, Ajinomoto buildup film, epoxy resin or polyphenylene oxide, and the combination(s) thereof.

13. The manufacturing method according to claim 8, wherein the step E further comprises:
   forming shielding lines on both sides of the signal line wherein the shielding lines and the signal line together pass through the position of the signal line leading-out opening.

14. The manufacturing method according to claim 8, wherein the step F further comprises:
   applying a photoresist layer on the second insulating layer;
   performing exposure and development to the photoresist layer to form a hole revealing the first end face of the shielding Cu pillar;
   plating Cu to the hole and forming the built-up shielding Cu pillar; and
   removing the photoresist layer.

15. The manufacturing method according to claim 8, wherein the step H further comprises:
   performing the thinning in a manner of mechanical grinding or plasma etching.

16. The manufacturing method according to claim 8, wherein the step I further comprises:
   applying seed layers on the third and first insulating layers which reveal the first and second end faces of the shielding Cu pillar;
   applying a photoresist layer on the seed layer;
   performing patterning to form a wiring pattern;
   plating Cu in the wiring pattern;
   peeling the photoresist layer; and
   removing the seed layer.

\* \* \* \* \*